(12) United States Patent
DeBrosse

(10) Patent No.: US 6,285,612 B1
(45) Date of Patent: Sep. 4, 2001

(54) REDUCED BIT LINE EQUALIZATION LEVEL SENSING SCHEME

(75) Inventor: John K. DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/603,683

(22) Filed: Jun. 26, 2000

(51) Int. Cl.$^7$ .................................................. G11C 7/00

(52) U.S. Cl. ............................................ 365/205; 365/207

(58) Field of Search .................................... 365/190, 203, 365/205, 207, 208

(56) References Cited

U.S. PATENT DOCUMENTS

| | | | |
|---|---|---|---|
| 4,816,706 | 3/1989 | Dhong et al. | 365/205 |
| 5,416,371 | 5/1995 | Katayama et al. | 365/205 |
| 5,689,461 | * 11/1997 | Kaneko et al. | 365/207 |
| 5,815,451 | 9/1998 | Tsuchida | 365/203 |
| 5,844,853 | 12/1998 | Kitsukawa et al. | 365/226 |
| 5,970,007 | * 10/1999 | Shiratake | 365/207 |
| 6,097,652 | * 8/2000 | Roh | 365/205 |

OTHER PUBLICATIONS

IBM Technical Disclosure Bulletin, Vo. 36, No. 1, pp. 286–289 (Jan. 1993).

S.H. Dhong et al., "High–Speed Sensing Scheme for CMOS DRAMS's", IEEE Journal of Solid–State Circuits, vol. 23, No. 1 pp. 34–40 (Feb. 1988).

\* cited by examiner

Primary Examiner—Trong Phan
(74) Attorney, Agent, or Firm—Ratner & Prestia; Tiffany L. Townsend, Esq.

(57) ABSTRACT

A method for obtaining equalization voltages that are a fraction of bit line high other than ½ in a DRAM semiconductor circuit, and an associated circuit, in arrangements that include a plurality of block cell arrays with a plurality of complementary pairs of bit lines connected to each block array with control lines to selectively activate a desired array block. Each block uses shared sense amplifiers connected to the pairs of bit lines and there is an equalization circuit connected between each of the bit line pairs of each of the array blocks, between each of the array blocks and the shared sense amplifiers. A charge flow circuit is also connected between each of the bit line pairs of each of the array blocks, between each of the array blocks and the shared sense amplifiers. A charge flow circuit control line is connected to the charge flow circuits for connecting the charge flow circuit to an electrical ground, thereby to act as a discharge circuit or to the bit line high voltage. By selecting a number of inactive bit line pairs in a block to be connected to either ground or bit line high voltage the equalization voltage can be readily maintained at a fraction of bit line high voltage other than ½.

13 Claims, 3 Drawing Sheets

REDUCED BIT LINE EQUALIZATION LEVEL SENSING SCHEME

TECHNICAL FIELD

The present invention relates to a new sensing scheme for CMOS DRAM's and more particularly, to a method and associated circuit for rapidly applying an equalization voltage Vbleq other than equal to ½ Vblh

BACKGROUND OF THE INVENTION

Dynamic RAMs have been a major driving force behind VLSI technology development and their density and performance in terms of speed have increased at a very fast pace.

A most critical aspect of DRAM design is choosing a sensing scheme which can detect a small amount of charge transferred from a storage capacitor (cell) and then restore the charge back again. A typical DRAM sensing scheme involves pre-charging a bit line to a certain voltage, transferring a charge from a storage capacitor to the bit line to develop a signal on the bit line, sensing and amplifying this signal, and then restoring the charge to the storage capacitor.

As is well known in the art, the signal developed on the bit lines is highly dependent among other things, on the pre-charge voltage of the bit lines, and the bit line capacitances.

CMOS DRAMs, first introduced commercially in the 256K DRAM configuration were proven highly successful. By 1998 64 Megabit drams were available and 1 gigabit are now contemplated. These structures are the result of highly packed architectures in which the dimensions of the different elements become of the order of 0.20 μm or less. Such tight packing necessitates lowering the power supply voltage from the original 5 volts to 3.5 volts for the 16 megabit DRAMs, to 2.5 volts for the 256 Megabit DRAMs and may reach low level of 1.5 volts for a 1 Gigabit structure.

In the past, typical pre-charge levels were ½ Vblh (high voltage applied to the bit line) as this tends to be a natural voltage for the bit-lines that is easy to obtain by an equalization circuit on the bit lines. However, as the power supply voltage is reduced and the bit-line high voltage becomes lower and lower, this also results in lowering the pre-charge level of the bit-lines to the point where the overdrive on the transfer gate during signal development becomes quite small, resulting in a long signal development time. Various pre-charging techniques for sensing circuits have been developed in an effort to compensate for this problem, among the most successful being techniques that pre-charge the bit lines to ⅔ of Vblh or more in cases of PMOS arrays, and to ⅓ or less in cases of NMOS arrays.

U.S. Pat. No. 5,416,371 shows one method that obtains the ⅔ Vblh pre-charge voltage by limiting the downward swing of the bit-lines to ⅓ Vblh. This solution requires a sophisticated and complex special driver circuit increasing the cost of production. The major problem in attempting to pre-charge the bit-lines to other than ½ Vblh is that what may be called as the natural or steady state of the circuit is with the bit lines at ½ Vblh due to the circuit symmetry that results in a charge distribution that tends to equalize the bit lines at ½ Vblh. Therefore any other equalization scheme requires a substantial power supply and time to pre-charge and maintain a voltage other than the ½ Vblh on the bit lines.

There remains, therefore a need for a scheme that will permit rapidly pre-charging the bit-lines to voltages other than the ½ Vblh without needing a substantial power supply in the equalization circuit.

SUMMARY OF THE INVENTION

To meet this and other needs, and in view of its purposes, it is an object of the present invention to provide a circuit that permits to pre-charge bit lines to a desired voltage Vbleq other than Vblh/2. Specifically, the invention is a DRAM semiconductor circuit comprising:

a) plurality of block cell arrays each array comprising a plurality of complementary pairs of bit lines, and control lines to selectively activate a desired one of the plurality of array blocks;

b) a plurality of shared sense amplifiers connected to the pairs of bit lines;

c) an equalization circuit connected between each of the bit line pairs of each of the array blocks, between each of the array blocks and the shared sense amplifiers;

d) a charge flow circuit also connected between each of the bit line pairs of each of the array blocks, between each of the array blocks and the shared sense amplifiers; and e) a charge flow circuit control line connected to the charge flow circuits for connecting the charge flow circuit to an electrical ground, thereby to act as a discharge circuit.

In an alternate embodiment the charge flow circuit is connected instead of an electrical ground to the bit line high voltage (Vblh). In this embodiment the charge flow circuit acts as a charging circuit.

It is a further object of this invention to provide a method for obtaining a desired bit line equalization voltage in a dram circuit comprising an active and an inactive block of bit line arrays alternatively connected to shared sense amplifiers, said equalization voltage being a fraction of an applied bit line high voltage Vblh less than ½ Vblh, the method comprising calculating a number of bit line pairs to be discharged by grounding, using the following relationship:

Number of bit lines to be discharged in inactive block= [number of high bit lines in active block/desired fraction of Vblh]–Total number of bit lines in active block, and discharging by grounding this number of bit lines in the inactive block.

It is also an object of this invention to provide a method for obtaining a desired bit line equalization voltage in a dram circuit comprising an active and an inactive block of bit line arrays alternatively connected to shared sense amplifiers, said equalization voltage being a fraction of an applied bit line high voltage Vblh greater than ½ Vblh, the method comprising calculating a number of bit line pairs to be charged by connecting to the bit line high voltage, using the following relationship:

Number of bit lines to be connected to Vblh in inactive block=[number of low bit lines in active block/(1-desired fraction of Vblh)]–Total number of bit lines in active block, And connecting this number of bit lines in the inactive block to the bit line high voltage.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be explained with reference to the figures, wherein same numerals are used to designate same parts in all figures.

Figure 1:
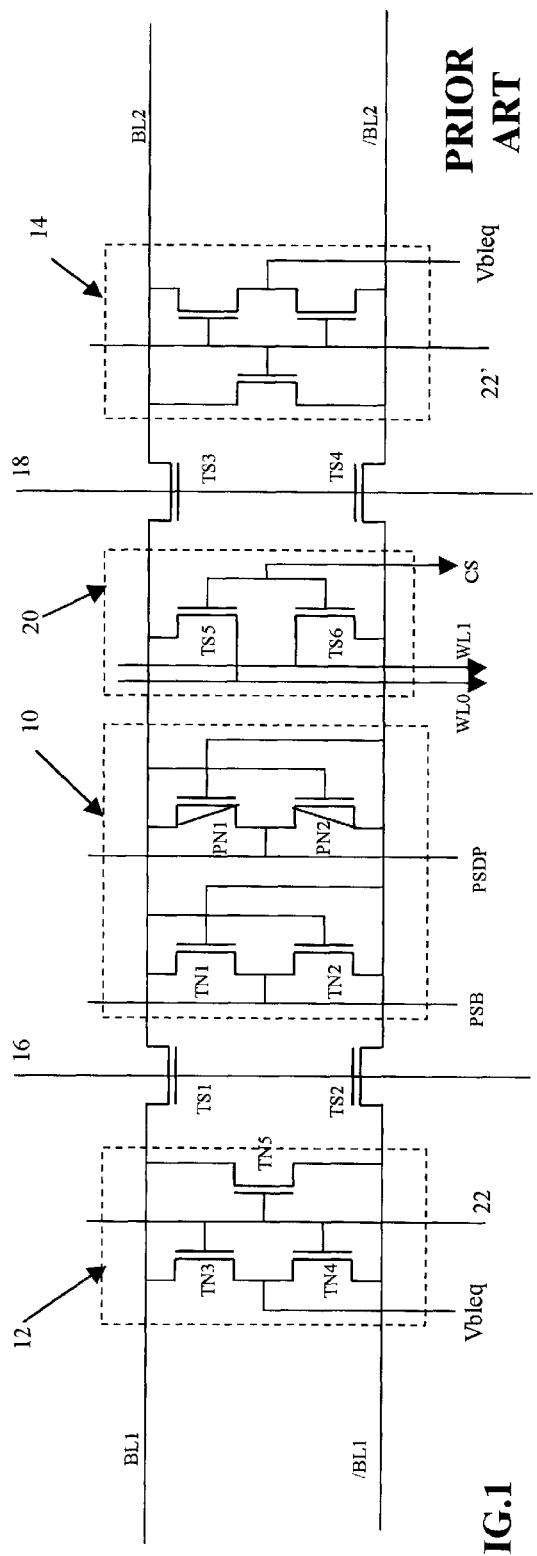
FIG. 1 shows a typical shared sense amplifier circuit connected to one pair of bit lines each from an active and inactive block.

FIG. 1 shows a typical shared sense amplifier 10 used in a DRAM circuit that also comprises two pairs of bit lines, BL1 and /BL1 and BL2 and BL2. The bit line pairs are connected to the sense amplifier through switching transistors TS1, TS2, TS3 and TS4. These transistors are controlled by a multiplexer not shown connected to the switching transistors via lines 16 and 18. The function of these switches is to alternately connect BL1,/BL1 or BL2,/BL2 alternately activating and de-activating the left and right side blocks of bit lines relative to the shared amplifier.

The sense amplifier is a latch amplifier of the type used in CMOS DRAM, whose design is well known in the art. When the left side block is activated and transistor switch connects BL1,/BL1 to the sense amplifier, BL1, /BL1, PSB, and PSDB float and have the same voltage value, typically the precharge bit line voltage. DRAM activation circuit 20 supplies a charge from a selected DRAM capacitor (not shown) over word (data) lines WL0 and WL1. This produces a voltage difference between BL1, and /BL1. PSB goes gradually to ground and PSDP goes to the bit line high voltage (Vblh) bringing one of the bit lines to Vblh and the other to 0 volts.

At the end of the row cycle, the word line is turned off, PSB and PSDB are shorted together disabling the sense amplifier 10, and equalizers 12 and 14 and both multiplexers are turned on, shorting all four bitlines BL1, /BL1, BL2, /BL2 and the sense amplifier nodes to Vbleq.

In the above arrangement, the equalization voltage tends to settle at a value Vblh/2. Such value is easy to maintain, and is a value that is satisfactory when Vblh is substantial, as it was when Vblh was of the order of 5 volts. However, as was discussed earlier, high density memories have resulted in substantially lower values for Vblh and as result an equalization voltage equal to Vblh/2 applied to the FET gates is only marginally above the threshold voltages required to operate the FET. As a result the response time to bring the Bit lines to the precharge voltage and the read out time for the readout signal both become unacceptably long for use with today's high speed processors.

Figure 2:
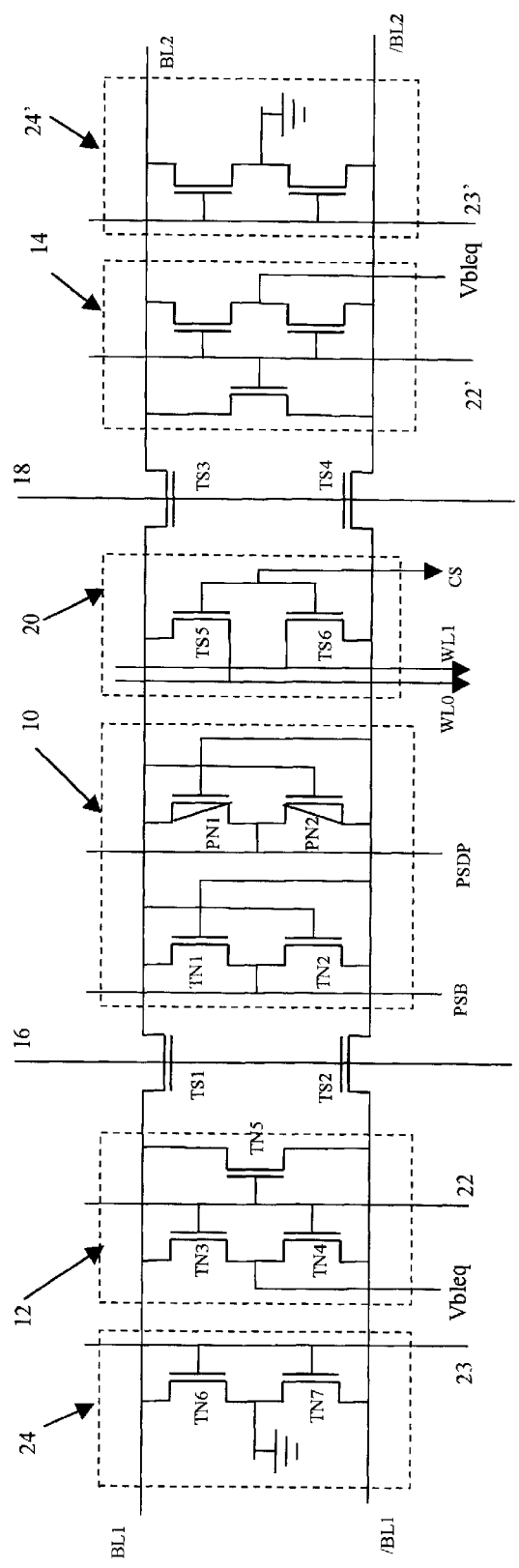
FIG. 2 shows the circuit shown in FIG. 1 modified by the addition of a circuit implementing a first embodiment of this invention.

FIG. 2 shows how the circuit illustrated in FIG. 1 is modified according to the present invention to permit use of other, higher fractions of Vblh for the equalization voltage to which the bit lines are precharged without the need for strong equalization voltage power supplies.

FIG. 2 shows the same sense amplifier 10, word lines access 20, switches TS1–TS4, multiplexing control lines 16 and 18, Bit line pairs BL1, /BL1 and BL2, /BL2, and equalization circuits 12 and 14. However, in addition to the above circuits, there are introduced two additional circuits 24 and 24' located on either side of the sense amplifier between the sense amplifier and the block of bit lines, and connected between each pair of bit lines as shown. Circuit 24 shorts to ground the bit lines connected to it, by providing a charge flow path through transistors TN6 and TN7 thereby discharging the bit lines. TN5 and TN6 are turned on/off on command through control line 23. Circuit 24' is identical to circuit 24 and is controlled through control line 23'. In a complete DRAM circuit there are, of course, a plurality of bit line pairs, and corresponding shared sensing amplifiers, with equalization circuits on either side of the amplifiers, and according with the present invention with the circuits 24 and 24' located on either side of each amplifier. We will refer to the circuits 24, 24' as charge a charge flow circuit.

In operation, the equalization circuits 12 and 14 are connected to a weak power source having an output equal to the desired fraction of the Vblh. Typically such fraction may be Vblh/3 or Vblh/4 for NMOS systems.

Assuming that it is desired to maintain an equalization voltage of Vblh LESS THAN Vblh/2 on the bit lines, we proceed as follows.

First the size of the left and right block of bit lines is determined and the number of bit lines in each of the two blocks ascertained. Next, the number of bit lines at state bit line high in an active block, i.e. a block where the bit lines are connected to the shared sensor amplifier, at any time is also determined. Then a number of bit lines in the inactive block of lines is connected to ground through activation of a number of charge flow circuits. The number of bit lines to be discharged in inactive block=[number of high bit lines in active block/desired fraction of Vblh]–Total number of bit lines in active block.

Figure 4:
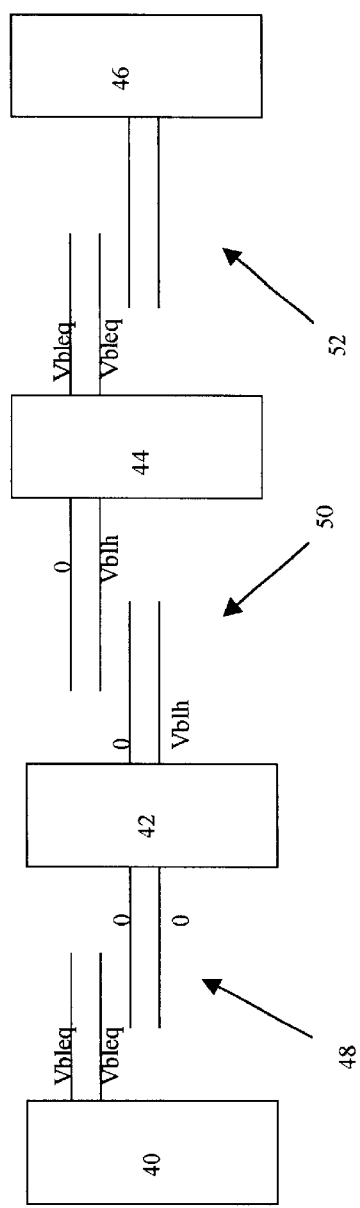
FIG. 4 illustrates an schematic representation of a typical DRAM memory comprising a number of bit lines in active and inactive blocks connected to shared sense amplifiers.

FIG. 4 shows in schematic representation a DRAM circuit having a number of sense amplifier blocks 40, 42, 44 and 46 to which are connected bit lines originating in bit line blocks 48, 50, and 52. An active bit line array block is shown as array 50 and two inactive arrays 48 and 52 are also shown. Only two bit line pairs are illustrated in each array, to simplify the explanation of the present method. The sense amplifier in sense amplifier block 44 is connected to the bit left bit lines which are at Vblh and 0 volts respectively.

As shown in FIG. 4 there are four bit lines in the active bit line array block 50 and there are two bit lines at Vblh. Thus to obtain a Vbleq=⅓ Vblh,(FrVblh) we do the following calculation:

Total Lines (TL) in active block 50, =4

Lines at Vblh (LVh) in block 50, =2

Lines to be discharged in inactive block through the charge flow circuit(DL):

$$DL=[LVh/FrVlbh]-TL=[2/(1/3)]-4=2$$

Two bit lines should be discharged to ground to obtain the desired Vbleq=⅓ Vblh.

Figure 3:
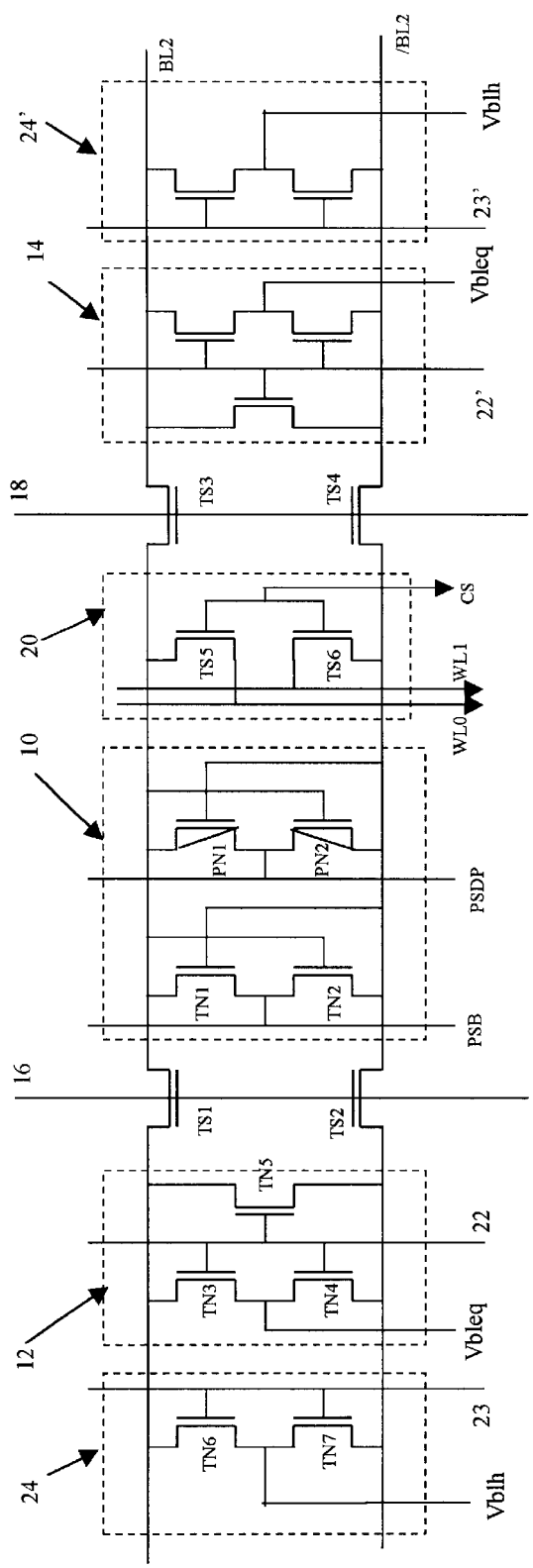
FIG. 3 shows the circuit shown in FIG. 1 modified by the addition of a circuit implementing a second embodiment of this invention.

In an alternate embodiment, where the desired Vbleq is higher than Vblh/2, the circuit shown in FIG. 3 is modified as shown in FIG. 4, by connecting the common point between TN6 and TN7 in the charge flow circuits 24 and 24' to the bit line high voltage source instead of ground. In such case the number of bit lines in the inactive block that are to be connected to the supply Vblh (CL) is calculated as follows:

Number of bit lines to be connected to Vblh in inactive block=[number of low bit lines in active block/(1-desired fraction of Vblh)]-Total number of bit lines in active block.

Thus to obtain ⅔ Vblh for the system of FIG. 4, the calculation is as follows:

$$CL=[LVl/(1-FrVlbh)]-TL=[2/(1-\tfrac{2}{3})]-4=2.$$

Figure 5:
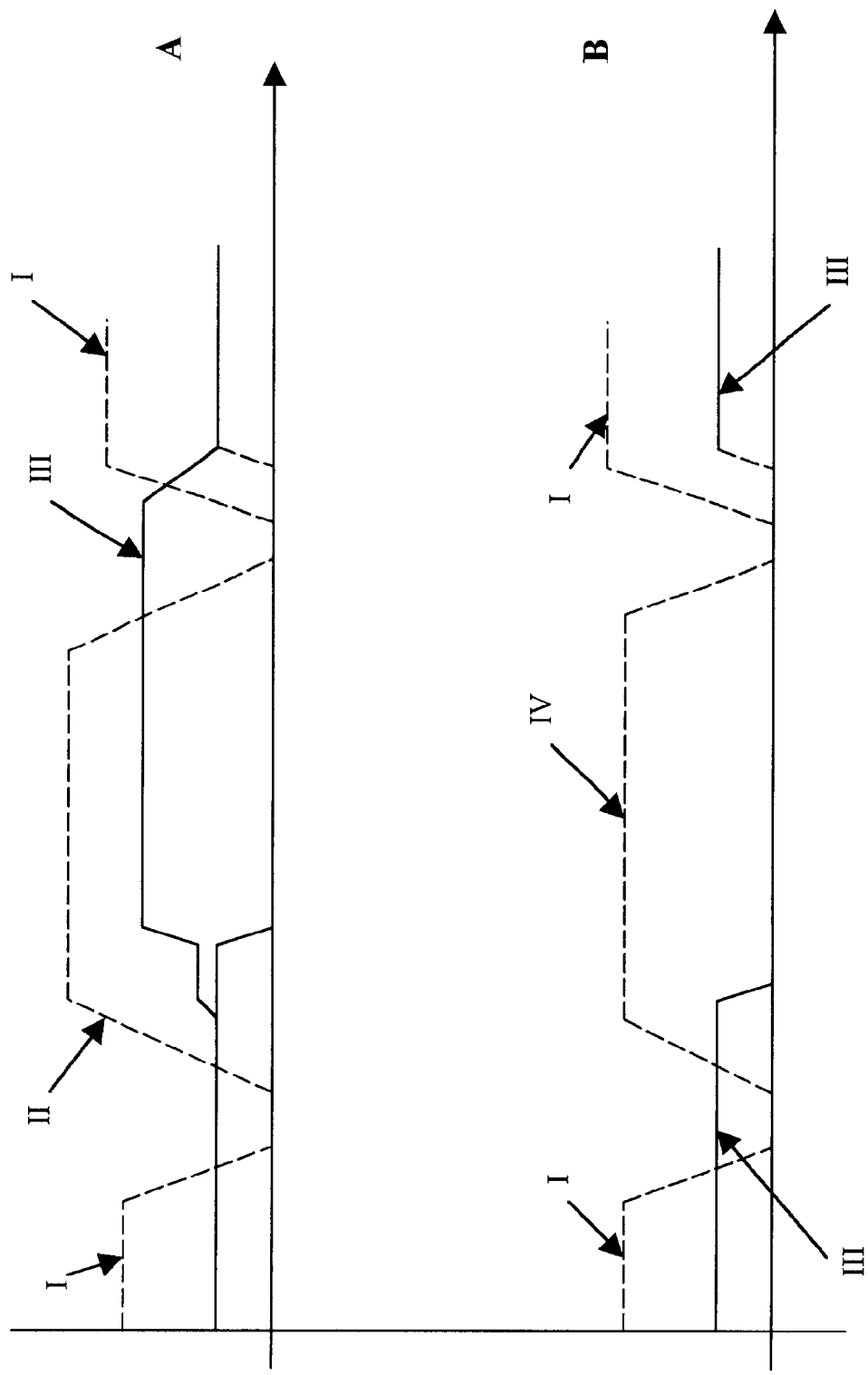
FIG. 5 shows a timing diagram illustrating the voltage rise and fall in the bit and word lines on the active and inactive sides of the shared sense amplifier when the circuit shown in FIG. 2 is used.

FIG. 5 shows the timing diagram for readout, equalization and charge flow circuits. Time line "A" shows the active side of the sense amplifier, and time line "B" the inactive side. Both begin with the bit lines all precharged to Vbleq. Time line "A" turns off the equalization cycle and initiates data flow through the word line. The bit line voltage slowly rises to Vblh, and remains there after readout to recharge the signal storage capacitors at which time the equalization command activates the equalization circuit and brings the Bit lines back to Vbleq. At the same time, on the inactive side of the sense amplifier, after the equalization command is off a charge flow command is initiated in the charge flow circuit 24 connecting the selected inactive bit lines to ground and discharging the inactive bit lines to 0. At the end of the readout cycle the bit lines are disconnected from ground and brought to Vbleq.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the method disclosed is not limited to the exact circuit illustrated for its implementation and that other switching circuits may s well be used to perform the functions of the circuits disclosed.

What is claimed is:

1. A DRAM semiconductor circuit comprising:
   a) a plurality of block cell arrays each array comprising a plurality of complementary pairs of bit lines, and control lines to selectively activate a desired one of said plurality of array blocks;
   b) a plurality of shared sense amplifiers connected to said pairs of bit lines;
   c) an equalization circuit connected between each of said pairs of bit lines of each of said array blocks between each of said array blocks and said shared sense amplifiers;
   d) a charge flow circuit also connected between each of said pairs of bit lines of each of said array blocks between each of said array blocks and said shared sense amplifiers; and
   e) a charge flow circuit control line connected to said charge flow circuits for connecting said charge flow circuit to one of an electrical ground and a bit line high voltage (Vblh).

2. The semiconductor circuit according to claim 1 wherein the sense amplifier further comprises a first latch circuit comprising a pair of cross coupled NMOS FETs each having a gate, a source and a drain, wherein the drain of a first FET of said pair of FETs is connected to the first bit line and the source of the second FET is connected to the second bit line, and wherein the gate of the first NMOS FETs is connected to the second bit line and the gate of the second NMOS FET is connected to the first bit line.

3. The semiconductor circuit according to claim 2 wherein the equalization circuit is connected to a voltage source and applies to the bit lines an equalization voltage Vbleq between ¼*vblh and ¾*vblh.

4. The semiconductor circuit according to claim 1 wherein said the charge flow circuit comprises a pair of switching transistors serially connected between said bit lines the drain of a first of said transistors being connected to the source of a second of said transistors at a point intermediate said serially connected transistors, and wherein said point is also connected to ground.

5. The semiconductor circuit according to claim 4 wherein said switching transistors are MOS FET transistors.

6. The semiconductor circuit according to claim 1 further comprising a bit line source of high voltage Vblh, and wherein said the charge flow circuit comprises a pair of switching transistors serially connected between said bit lines the drain of a first of said transistors being connected to the source of a second of said transistors at a point intermediate said serially connected transistors, and said point is also connected to the source of high voltage Vblh.

7. The semiconductor circuit according to claim 6 wherein said switching transistors are MOS FET transistors.

8. A method for obtaining a desired bit line equalization voltage in a dram circuit comprising an active and an inactive block of bit line arrays alternatively connected to shared sense amplifiers, said equalization voltage being a fraction of an applied bit line high voltage Vblh less than ½ Vblh, the method comprising calculating a number of bit line pairs to be discharged by grounding using the following relationship:

Number of bit lines to be discharged in inactive block= [number of high bit lines in active block/desired fraction of Vblh]-Total number of bit lines in active block, and discharging by grounding said number of bit lines in the inactive block.

9. The method according to claim 8 further comprising also applying to said bit lines an equalization voltage Vbleq equal to the desired fraction of Vblh.

10. The method according to claim 9 wherein the grounding of said bit lines and the applying of an equalization voltage are done using two separate circuits.

11. A method for obtaining a desired bit line equalization voltage in a dram circuit comprising an active and an inactive block of bit line arrays alternatively connected to shared sense amplifiers, said equalization voltage being a fraction of an applied bit line high voltage Vblh greater than ½ Vblh, the method comprising calculating a number of bit line pairs to be discharged by grounding using the following relationship:

number of bit lines to be discharged in inactive block= [number of low bit lines in active block/(1-desired fraction of Vblh)]-Total number of bit lines in active a block, and connecting said number of bit lines in the inactive block to the source of Vblh.

12. The method according to claim 11 further comprising also applying to said bit lines an equalization voltage Vbleq equal to the desired fraction of Vblh.

13. The method according to claim 12 wherein the connecting of said bit lines to the source of Vblh and the applying of an equalization voltage are done using two separate circuits.

* * * * *

UNITED STATES PATENT AND TRADEMARK OFFICE
CERTIFICATE OF CORRECTION

PATENT NO.   : 6,285,612 B1
DATED        : September 4, 2001
INVENTOR(S)  : John K. DeBrosse It is certified that error appears in the above-identified patent and that said Letters Patent is hereby corrected as shown below:

<u>Column 3,</u>
Line 25, delete the second "BL2" and insert -- /BL2 --; and

<u>Column 5,</u>
Line 7, delete "CL = [LV1/(1-FrVlbh)]-TL = [2/(1-2/3)]-4 = 2" and insert -- CL = [LV1/(1-FrVblh)]-TL = [2/(1-2/3)]-4 = 2 --.

Signed and Sealed this

Twenty-fourth Day of September, 2002

Attest:

Attesting Officer

JAMES E. ROGAN
*Director of the United States Patent and Trademark Office*